United States Patent

Utsuno

(10) Patent No.: US 9,281,383 B2
(45) Date of Patent: Mar. 8, 2016

(54) METHOD FOR FABRICATING A SEMICONDUCTOR DEVICE

(71) Applicant: KABUSHIKI KAISHA TOSHIBA, Tokyo (JP)

(72) Inventor: Yukihiro Utsuno, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 185 days.

(21) Appl. No.: 13/896,808

(22) Filed: May 17, 2013

(65) Prior Publication Data

US 2014/0162417 A1    Jun. 12, 2014

(30) Foreign Application Priority Data

Dec. 6, 2012   (JP) ................................. 2012-267056

(51) Int. Cl.
| | |
|---|---|
| *H01L 29/788* | (2006.01) |
| *H01L 21/8239* | (2006.01) |
| *H01L 29/66* | (2006.01) |
| *H01L 29/10* | (2006.01) |
| *H01L 27/115* | (2006.01) |
| *H01L 21/265* | (2006.01) |

(52) U.S. Cl.
CPC .... *H01L 29/66825* (2013.01); *H01L 27/11531* (2013.01); *H01L 21/2652* (2013.01); *H01L 27/11521* (2013.01); *H01L 27/11524* (2013.01); *H01L 29/105* (2013.01); *H01L 29/1054* (2013.01)

(58) Field of Classification Search
CPC .................. H01L 27/11521; H01L 27/11524; H01L 27/11531; H01L 29/66825; H01L 21/2652; H01L 29/105; H01L 29/1054
USPC ........................................................... 438/556
See application file for complete search history.

(56) References Cited

U.S. PATENT DOCUMENTS

| | | | | |
|---|---|---|---|---|
| 4,199,860 A | * | 4/1980 | Beelitz et al. ................. | 438/326 |
| 4,649,626 A | * | 3/1987 | Leong ........................... | 438/164 |
| 4,743,565 A | * | 5/1988 | Goth et al. .................... | 438/327 |
| 4,764,478 A | | 8/1988 | Hiruta | |
| 4,893,166 A | * | 1/1990 | Geekie .......................... | 257/536 |
| 4,914,046 A | * | 4/1990 | Tobin et al. ................... | 438/592 |
| 5,028,564 A | * | 7/1991 | Chang et al. .................. | 438/412 |

(Continued)

FOREIGN PATENT DOCUMENTS

| | | |
|---|---|---|
| JP | 7-101677 | 11/1995 |
| JP | 08-078674 A | 3/1996 |

(Continued)

OTHER PUBLICATIONS

Office Action mailed Nov. 24, 2015 in Japanese Patent Application No. 2012-267056 (with English Translation).

*Primary Examiner* — Mary Wilczewski
(74) *Attorney, Agent, or Firm* — Oblon, McClelland, Maier & Neustadt, L.L.P.

(57) ABSTRACT

A method for fabricating a semiconductor device according to an embodiment, includes forming a silicon (Si) film containing carbon (C) in an upper portion thereof above a semiconductor substrate, performing element isolation of the Si film and the semiconductor substrate to make a width dimension of the Si film narrow in a first region and a width dimension of the Si film wide in a second region, after the element isolation, exposing a side face of the Si film in at least the first region, and diffusing boron (B) into the Si film from the side face of the Si film in the first region.

18 Claims, 13 Drawing Sheets

(56) References Cited

U.S. PATENT DOCUMENTS

| | | | |
|---|---|---|---|
| 5,308,790 A * | 5/1994 | Allman et al. | 438/561 |
| 5,580,797 A * | 12/1996 | Miwa et al. | 438/311 |
| 5,786,258 A * | 7/1998 | Miwa et al. | 438/337 |
| 5,960,284 A * | 9/1999 | Lin et al. | 438/259 |
| 6,030,873 A * | 2/2000 | Iwamatsu et al. | 438/295 |
| 7,045,397 B1 * | 5/2006 | Yu et al. | 438/135 |
| 7,238,587 B2 | 7/2007 | Hoshi et al. | 438/424 |
| 7,598,151 B2 * | 10/2009 | Hoshi et al. | 438/424 |
| 7,829,420 B2 * | 11/2010 | Lowis | 438/298 |
| 7,875,922 B2 * | 1/2011 | Arai et al. | 257/316 |
| 8,481,989 B2 * | 7/2013 | Kai et al. | 257/2 |
| 8,497,545 B2 * | 7/2013 | Jee et al. | 257/315 |
| 8,524,559 B2 * | 9/2013 | Lin et al. | 438/270 |
| 8,530,329 B2 * | 9/2013 | Choi et al. | 438/427 |
| 8,592,273 B2 * | 11/2013 | Sim et al. | 438/257 |
| 8,686,488 B2 * | 4/2014 | Kondo et al. | 257/316 |
| 8,829,644 B2 * | 9/2014 | Sim et al. | 257/510 |
| 2002/0151136 A1 * | 10/2002 | Lin et al. | 438/259 |
| 2007/0042547 A1 | 2/2007 | Kikuchi et al. | |
| 2008/0090352 A1 * | 4/2008 | Lee et al. | 438/257 |
| 2009/0140317 A1 | 6/2009 | Rosmeulen | |
| 2009/0236653 A1 | 9/2009 | Kikuchi et al. | |
| 2011/0204433 A1 | 8/2011 | Fujita et al. | |
| 2011/0291174 A1 | 12/2011 | Ooike et al. | |
| 2013/0105891 A1 * | 5/2013 | Lin et al. | 257/332 |
| 2013/0264649 A1 * | 10/2013 | Sim | 257/365 |
| 2014/0061758 A1 * | 3/2014 | Sim et al. | 257/316 |
| 2014/0162417 A1 * | 6/2014 | Utsuno | 438/264 |
| 2014/0264537 A1 * | 9/2014 | Sakamoto et al. | 257/316 |

FOREIGN PATENT DOCUMENTS

| | | |
|---|---|---|
| JP | 8-162620 | 6/1996 |
| JP | 9-36259 | 2/1997 |
| JP | 2007-53171 | 3/2007 |
| JP | 2009-141354 | 6/2009 |
| JP | 2011-176207 | 9/2011 |
| JP | 2011-253881 | 12/2011 |
| JP | 2012-038835 A | 2/2012 |

* cited by examiner

METHOD FOR FABRICATING A SEMICONDUCTOR DEVICE

CROSS-REFERENCE TO RELATED APPLICATION

This application is based upon and claims the benefit of priority from Japanese Patent Application No. 2012-267056 filed on Dec. 6, 2012 in Japan, the entire contents of which are incorporated herein by reference.

FIELD

Embodiments described herein relate generally to a method for fabricating a semiconductor device.

BACKGROUND

In development of a semiconductor device, particularly a semiconductor storage device, ever finer patterning is developed for memory cells to achieve larger capacities and lower costs. In a semiconductor storage device mounted with a floating gate structure such as a NAND nonvolatile semiconductor memory device, the wire pitch between word lines to be a control gate in a gate portion is made ever finer. Such finer patterning of LSIs is actively promoted to achieve performance improvement such as a faster operation and lower power consumption of elements due to higher integration and the reduction in manufacturing costs. In recent years, flash memories in minimum processing dimensions of, for example, 20 nm or so have been in mass production and still finer patterning and increasing technical difficulty are expected in the future.

A NAND nonvolatile semiconductor memory device capable of electrically rewriting data stores data by changing the amount of charge of the floating gate of a cell transistor to change the threshold voltage thereof. In general, electrons are emitted and injected between the floating gate and a semiconductor substrate via a gate dielectric film. The amount of charge of the floating gate is thereby controlled. However, various problems arise as finer circuit patterning is promoted in response to requests of finer patterning in recent years.

As a limit of finer patterning of a memory cell, a problem of difficulty of embedding a control gate between adjacent floating gates is known because the physical thickness of an IPD (Inter Poly Dielectric) film cannot be made thinner and the space between floating gates adjacent in an element isolation direction is filled with the IPD film. In addition, even if the control gate is embedded, a problem arises that the width thereof is too thin to function as an electrode. As a solution to such problems, for example, changing the polarity of a floating gate from the n type to the p type is attempted. In an n-type floating gate, the charge holding capability is not sufficient because electrons accumulate in an IPD film interface or a tunnel dielectric film of the floating gate after writing. In a p-type floating gate, by contrast, electrons recombine with holes after writing and no electron is present in the conduction band and thus, the charge holding capability thereof is considered to be superior. Therefore, the thickness of a tunnel dielectric film can be made thinner and when the same coupling ratio is maintained, the height of a floating gate can be decreased and the IPD dielectric film can be made thinner. Because carriers are injected into a p-type floating gate during a write operation, in addition to being a thin tunnel dielectric film, the write operation can be performed at a lower voltage. Accordingly, a leak current of the IPD dielectric film can also be reduced. Therefore, the aspect ratio can be decreased by adopting a p-type floating gate to make the thickness of an IPD film thinner or reduce the height of the floating gate so that still finer cells can be formed.

However, if a p-type floating gate is adopted, when a p-type impurity is doped, a problem arises that not only a memory cell region in which a floating gate is formed, but also a region of peripheral circuits such as a resistance element where the n-type polarity is desirable is similarly doped with the p-type impurity.

DETAILED DESCRIPTION

First Embodiment

A method for fabricating a semiconductor device according to an embodiment, includes forming a silicon (Si) film containing carbon (C) in an upper portion thereof above a semiconductor substrate, performing element isolation of the Si film and the semiconductor substrate to make a width dimension of the Si film narrow in a first region and a width dimension of the Si film wide in a second region, after the element isolation, exposing a side face of the Si film in at least the first region, and diffusing boron (B) into the Si film from the side face of the Si film in the first region.

In the first embodiment, a technique for reducing the amount of doping of a p-type impurity into a peripheral circuit region when a p-type floating gate is formed will be described below.

Also in the first embodiment, a case when a silicon (Si) film is doped with a p-type impurity by the gas phase doping method will be described below.

Also in the first embodiment, the method for fabricating a nonvolatile NAND flash memory device as an example of the semiconductor device will be described. However, the method for fabricating a semiconductor device described below is not limited to a NAND flash memory device and is also effective for other floating gate type semiconductor devices. The first embodiment will be described below using drawings.

Figure 1:
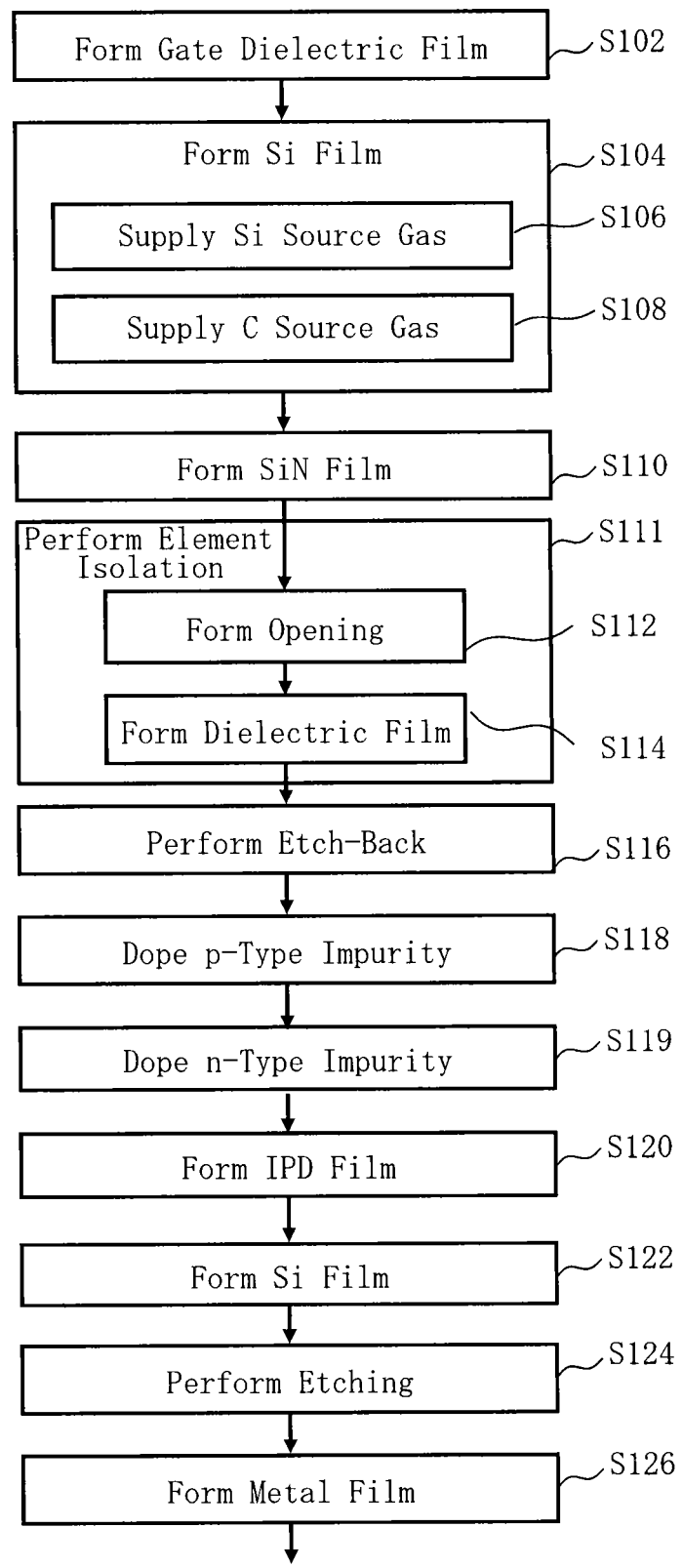
FIG. 1 is a flow chart showing principal processes of a method for fabricating a semiconductor device according to a first embodiment.

FIG. 1 is a flow chart showing principal processes of a method for fabricating a semiconductor device according to the first embodiment. In FIG. 1, the method for fabricating a semiconductor device according to the first embodiment performs a series of processes including a gate dielectric film formation process (S102), an Si film formation process (S104), a silicon nitride (SiN) film formation process (S110), an element isolation process (S111), an etch-back process (S116), a p-type impurity doping process (S118), an n-type impurity doping process (S119), an inter poly dielectric film (IPD film) formation process (S120), an Si film formation process (S122), an etching process (S124), and a metal film formation process (S126). The Si film formation process (S104) performs an Si source gas supply process (S106) and a carbon (C) source gas supply process (S108) as internal processes thereof. Also, the element isolation process (S111) performs an opening formation process (S112) and a dielectric film formation process (S114) as internal processes thereof.

Figure 2A:
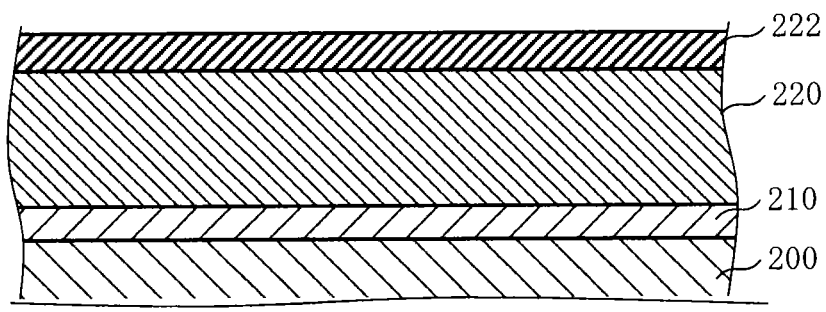
FIGS. 2A and 2B are process sectional views of the method for fabricating a semiconductor device according to the first embodiment.
Figure 2B:
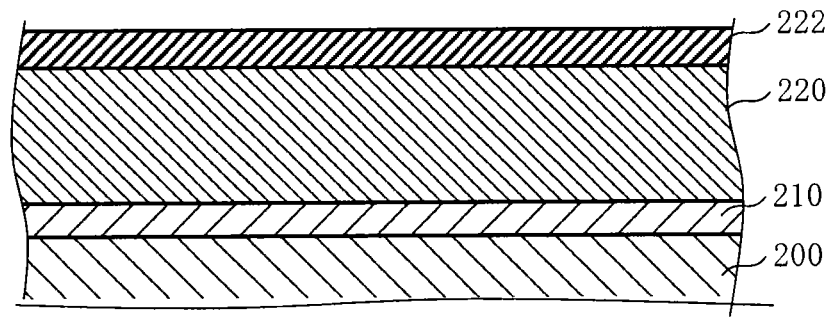

Process sectional views of the method for fabricating a semiconductor device according to the first embodiment are shown in FIGS. 2A and 2B. FIGS. 2A and 2B show the gate dielectric film formation process (S102) and the Si film formation process (S104). Subsequent processes will be described later. In FIG. 2A, a cross section of a memory cell region (first region) where a gate structure to be a memory cell is formed is shown. In FIG. 2B, a cross section of a peripheral circuit region (second region) where a peripheral circuit such as a resistance element, a MOS transistor or the like arranged around the periphery of a memory cell is formed is shown. FIGS. 2A and 2B show a cross section in a direction along a longitudinal direction of a control gate (CG) (word line). Also in diagrams subsequent to FIGS. 2A and 2B, FIGS. 5A to 9A, 10, and 11A to 14A each show a cross section in a direction along the longitudinal direction of the control gate (CG) (word line) in a memory cell region and FIGS. 5B to 9B and 11B to 14B each show a cross section in a direction along the longitudinal direction of the control gate (CG) (word line) in a peripheral circuit region.

In FIGS. 2A and 2B, as the gate dielectric film formation process (S102), a dielectric film 210 is formed on a semiconductor substrate 200 to a thickness of, for example, 1 to 15 nm. The dielectric film 210 functions as a tunnel dielectric film (gate dielectric film). For example, a silicon oxide ($SiO_2$) film or silicon oxynitride film is used as the dielectric film 210. An $SiO_2$ film is suitably formed by, for example, heat treatment (thermal oxidation treatment) in an atmosphere of oxygen as the formation method thereof. A silicon oxynitride film is suitably formed by, for example, a combination of heat treatment (thermal oxidation treatment) in an atmosphere of oxygen ($O_2$) and heat treatment (thermal nitridation treatment) in an atmosphere of nitrogen ($N_2$) as the formation method thereof. As the semiconductor substrate 200, for example, a p-type silicon substrate made of a silicon wafer of 300 mm in diameter is used.

Next, as the Si film formation process (S104), an Si film 220 (floating gate (FG) material film) (Si layer) having a C containing portion 222 in an upper portion thereof is formed on the dielectric film 210 to a thickness of, for example, 80 nm.

Figure 3:
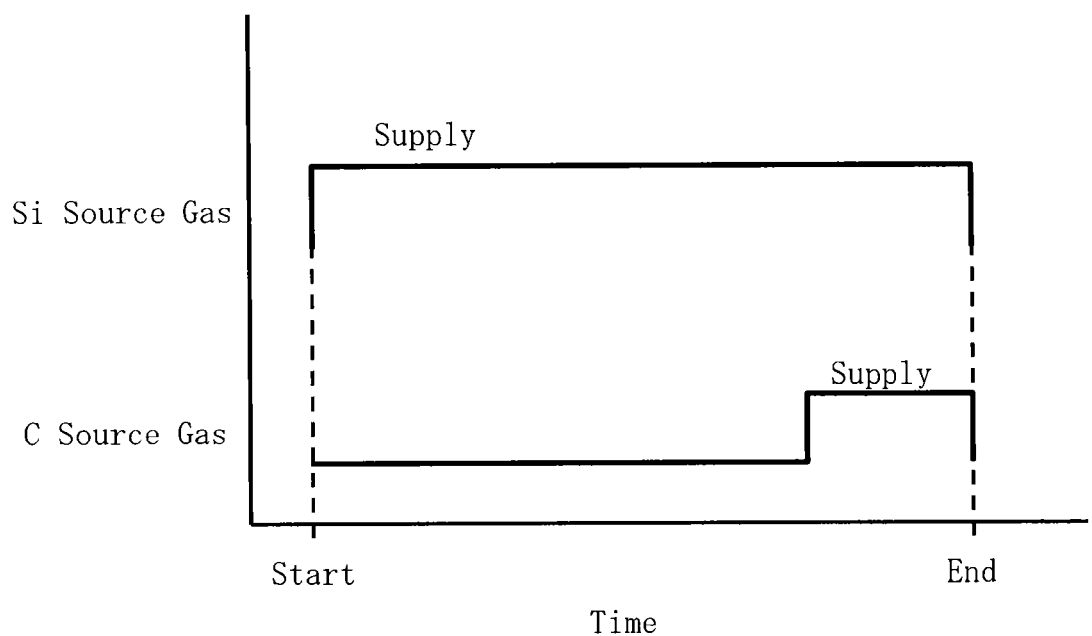
FIG. 3 is a time chart showing an example when an Si layer containing C in an upper portion thereof according to the first embodiment is formed.

FIG. 3 is a time chart showing an example when an Si layer containing C in an upper portion thereof according to the first embodiment is formed. To form the Si film 220, first as the Si source gas supply process (S106), an amorphous silicon film of, for example, 75 nm in thickness can be formed according to the low-pressure chemical vapor deposition (LP-CVD) method by supplying a mono-silane ($SiH_4$) gas as an Si source gas and controlling the film formation temperature to 500 to 600° C. Subsequently, as the C source gas supply process (S108), the upper portion of the amorphous silicon film of, for example, 5 to 10 nm is caused to contain C by further adding a C source gas to the content of the Si source gas supply process (S106). In other words, an Si layer containing C in the upper portion thereof is formed by adding a C source gas in the stage of forming the Si film of remaining, for example, 5 to 10 nm in thickness. Accordingly, the Si film 220 having the C containing portion 222 in the upper portion thereof can be formed. For example, an ethylene ($C_2H_4$) gas can be used as the C source gas. The amorphous silicon film to be the Si film 220 degenerates into a polysilicon film in a subsequent heating process (for example, the next SiN film formation process (S110)). Though boron (B) to be the p-type dopant is not introduced in the chamber here because the process is performed in the p-type impurity doping process (S118) described later, B to be the p-type dopant may also be suitably introduced in the chamber when an amorphous silicon film is formed.

Figure 4:
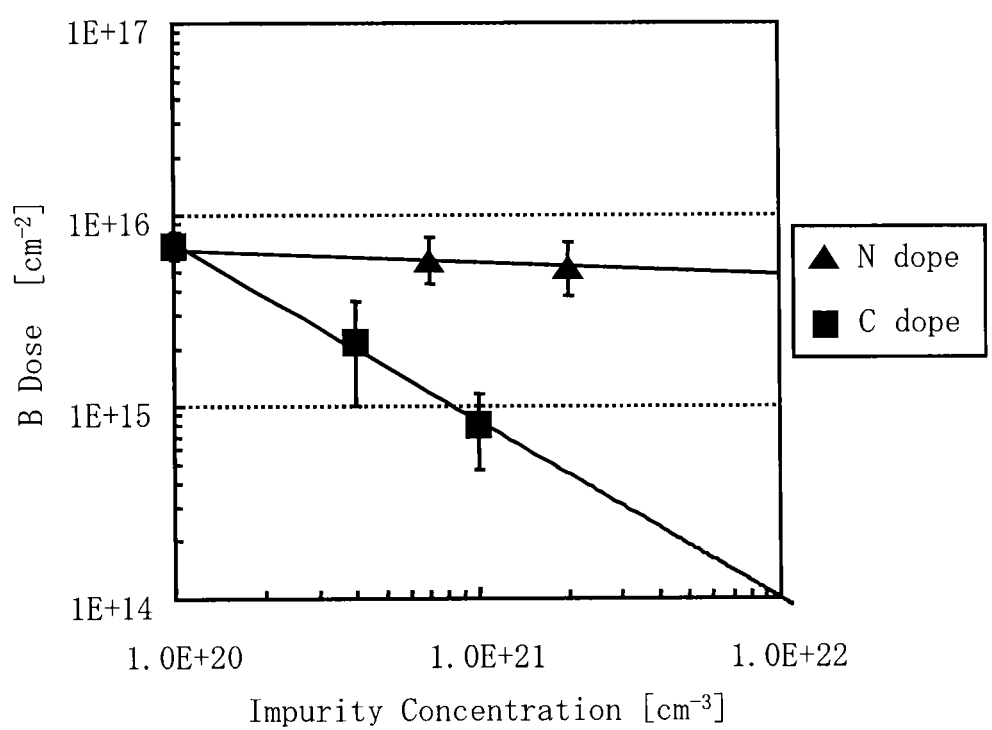
FIG. 4 is a graph showing the relationship between a boron (B) dose and an impurity concentration according to the first embodiment.

FIG. 4 is a graph showing the relationship between a boron (B) dose and an impurity concentration according to the first embodiment. In FIG. 4, the B dose ($cm^{-2}$) is represented as the vertical axis and the impurity concentration ($cm^{-3}$) is represented as the horizontal axis. A case when the Si film is doped with C as an impurity is shown here and a case when the Si film is doped with nitrogen (N) is shown as a comparative example. In FIG. 4, a case when the gas phase doping method is used when B is doped is shown. As shown in FIG. 4, when the Si film is doped with N as an impurity, it is clear that the Si film is almost similarly doped with B regardless of the concentration. When the Si film is doped with C as an impurity, by contrast, it is clear that the B dose with which the Si film is doped significantly decreases with an increasing concentration of C. Particularly when the C concentration is $4 \times 10^{20}$ ($cm^{-3}$) or more, the B dose can be suppressed to about $2 \times 10^{15}$ ($cm^{-2}$) or less that can be inverted to the n type in a subsequent process under the assumption of mass production of semiconductor devices. Thus, in the first embodiment, the C concentration in the C containing portion 222 in the upper portion of the Si film 220 is suitably adjusted to $4 \times 10^{20}$ ($cm^{-3}$) or more. Moreover, if the Si film contains C, the resistance thereof increases about 10 times that of the Si film without C and thus, the C containing portion 222 is suitably formed only in an upper portion of the Si film 220.

Figure 5A:
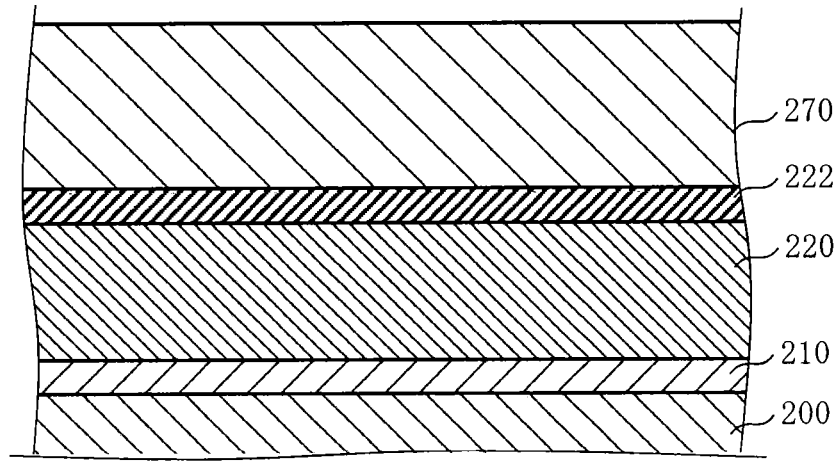
FIGS. 5A and 5B are process sectional views of the method for fabricating a semiconductor device according to the first embodiment.
Figure 5B:
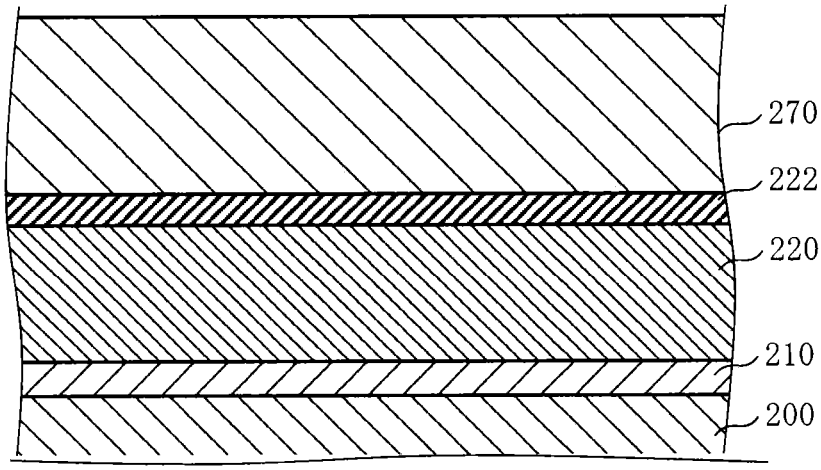

Process sectional views of the method for fabricating a semiconductor device according to the first embodiment are shown in FIGS. 5A and 5B. FIGS. 5A and 5B show the SiN film formation process (S110) in FIG. 1. Subsequent processes will be described later.

In FIGS. 5A and 5B, as the SiN film formation process (S110), an SiN film 270 is formed by using the chemical vapor deposition (CVD) method to a thickness of, for example, 50 to 400 nm. The SiN film 270 becomes a protective film of the Si film 220 in the opening formation process (S112) described later.

Figure 6A:
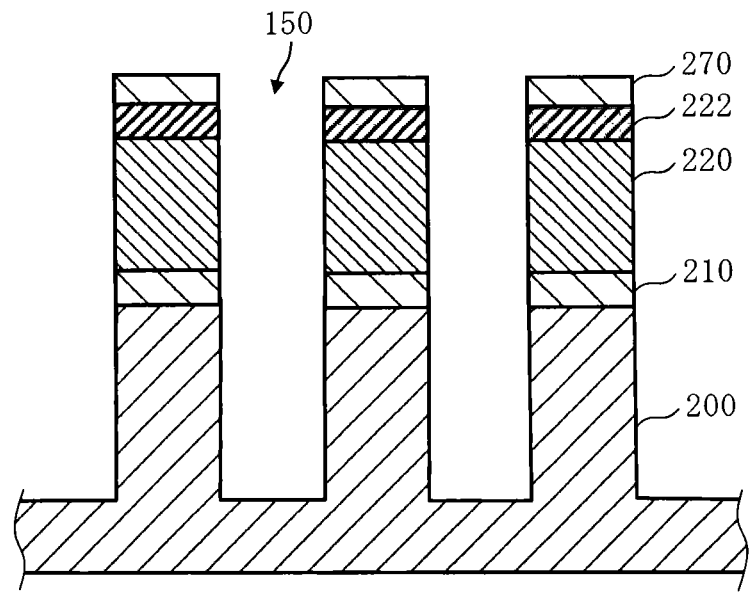
FIGS. 6A and 6B are process sectional views of the method for fabricating a semiconductor device according to the first embodiment.
Figure 6B:
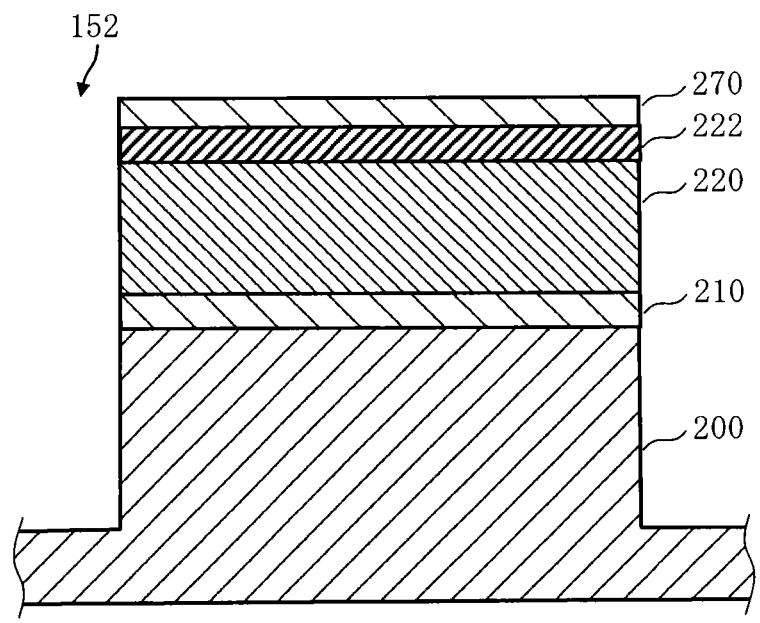

Process sectional views of the method for fabricating a semiconductor device according to the first embodiment are shown in FIGS. 6A and 6B. FIGS. 6A and 6B show the opening formation process (S112) in FIG. 1. Subsequent processes will be described later.

In FIGS. 6A and 6B, as the opening formation process (S112), grooved openings 150, 152 are formed by etching through (or "penetrating") the Si film 220 and the dielectric film 210 from the SiN film 270 and halfway through the semiconductor substrate 200. In a memory cell region shown in FIG. 6A, the opening 150 whose width is, for example, 20 nm or less is formed at intervals of 40 nm or less in pitch. In a peripheral circuit region shown in FIG. 6B, the opening 152 whose width is, for example, about 100 nm is formed at intervals of about 200 nm in pitch. The openings 150, 152 can be formed substantially perpendicularly to the surface of the semiconductor substrate 200 by removing the exposed SiN film 270 and the Si film 220 and the dielectric film 210 positioned thereunder by the anisotropic etching with respect to the semiconductor substrate 200 having a resist film formed on the SiN film 270 by undergoing a lithography process such as a resist coating process and exposure process (not shown). As an example, the openings 150, 152 may be formed by, for example, the reactive ion etching (RIE) method. The openings 150, 152 become an element isolation region.

Figure 7A:
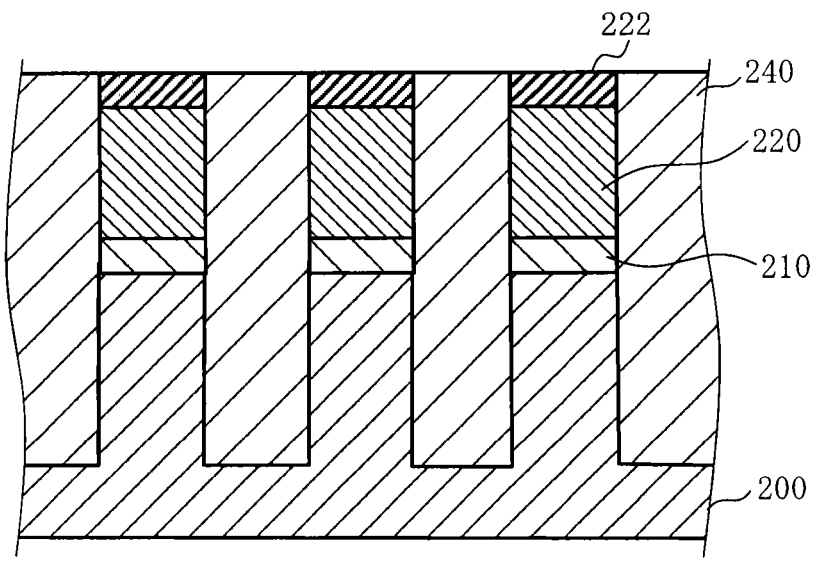
FIGS. 7A and 7B are process sectional views of the method for fabricating a semiconductor device according to the first embodiment.
Figure 7B:
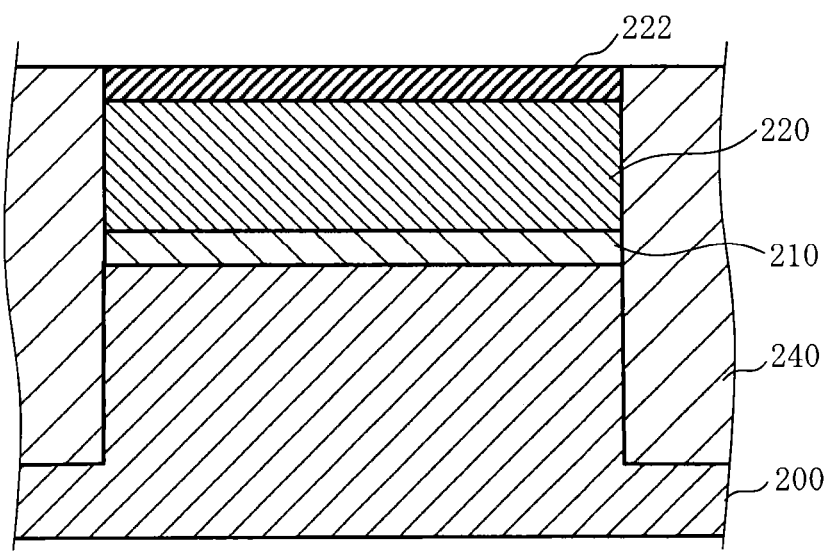

Process sectional views of the method for fabricating a semiconductor device according to the first embodiment are shown in FIGS. 7A and 7B. FIGS. 7A and 7B show the dielectric film formation process (S114) in FIG. 1. Subsequent processes will be described later.

In FIGS. 7A and 7B, as the dielectric film formation process (S114), a dielectric film 240 is formed in the openings 150, 152 and on the SiN film 270 to fill up the openings 150, 152 by using, for example, the CVD method, the coating process or the like.

Then, as a planarization process, the dielectric film 240 swelling out of the openings 150, 152, the dielectric film 240 on the SiN film 270, and the SiN film 270 are polished and removed by the chemical-mechanical polishing (CMP) method for planarization. Accordingly, as shown in FIG. 7A, element isolation (Shallow Trench Isolation (STI) structure) between memory cells is achieved. Similarly, as shown in FIG. 7B, the dielectric film 240 is arranged also on the device side face of peripheral circuits to achieve element isolation between devices of peripheral circuits. For example, an $SiO_2$ film is used as the dielectric film 240. For the Si film 220, the dielectric film 210, and the semiconductor substrate 200, as described above, element isolation is achieved in such a way that the width dimension of the Si film 220 is narrow in the memory cell region (first region) and the width dimension of the Si film 220 is wide in the peripheral circuit region (second region).

Figure 8A:
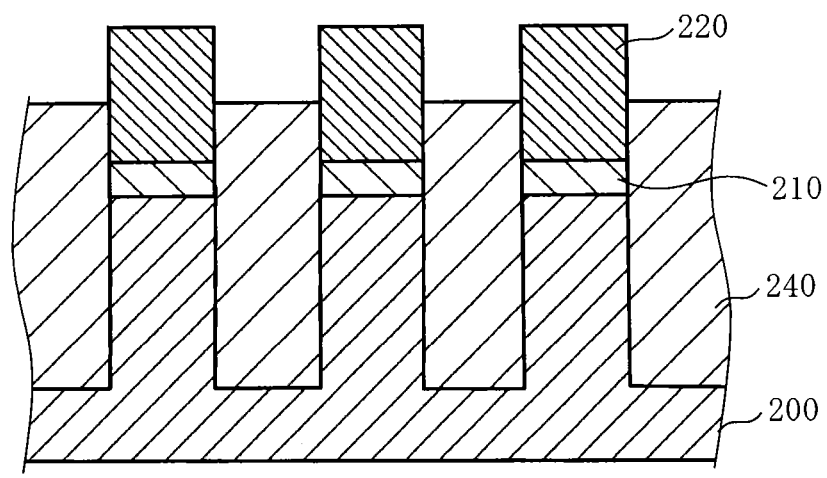
FIGS. 8A and 8B are process sectional views of the method for fabricating a semiconductor device according to the first embodiment.
Figure 8B:
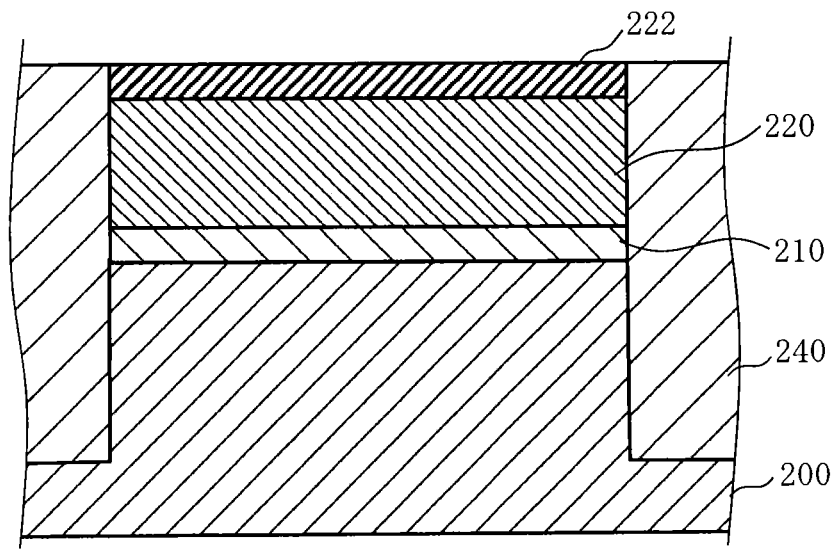

Process sectional views of the method for fabricating a semiconductor device according to the first embodiment are shown in FIGS. 8A and 8B. FIGS. 8A and 8B show the etch-back process (S116) in FIG. 1. Subsequent processes will be described later.

In FIG. 8A, as the etch-back process (S116), the dielectric film 240 is etched by the etch-back method in the memory cell region. Here, the surface of the dielectric film 240 for element isolation in the memory cell region is dug deeply by etching up to a height position halfway through the Si film 220 in the memory cell region shown in FIG. 8A by using photolithography technology and RIE technology or wet etching technology. Accordingly, the upper side face of the Si film 220 to be a polysilicon film for FG is exposed in the memory cell region. The C containing portion 222 has the thickness of 5 to 10 nm and thus, as shown in FIG. 8A, the C containing portion 222 in the upper portion of the Si film 220 in the memory cell region is removed together by the etch-back process (S116). Therefore, the upper surface and side face of the Si film 220 containing no C can be exposed by the etch-back process (S116) in the memory cell region.

On the other hand, in regions other than the memory cell region such as the peripheral circuit region, as shown in FIG. 8B, the dielectric film 240 for element isolation is suitably retained without etching by retaining the resist film (not shown). Accordingly, while at least the side face of the Si film 220 not doped with C is exposed in the memory cell region, any surface of the Si film 220 not doped with C can be prevented from being exposed in the peripheral circuit region. That is, in the peripheral circuit region, state in which the upper surface of the Si film 220 is covered with the C containing portion 222 and the side face thereof is covered with the dielectric film 240 can be created.

When a p-type floating gate (FG) is adopted, a problem of depletion due to insufficient active carriers arises. This can be considered to be caused by insufficient B that is electrically active because even if a sufficient amount of B is injected as a p-type dopant, B goes out while a cell being processed or B is in inactivated by a heating process. More specifically, if the Si film 220 is doped with B while being formed, B in the Si film 220 is precipitated in defective portions or the interface due to heating treatment in a process after the Si film 220 formation or B in the Si film 220 goes out due to the etch-back process (S116). In addition, B in the Si film 220 is inactivated due to heating treatment in other processes. Because of the above reasons, electrically active B in the Si film 220 is insufficient. Thus, a depletion layer in FG grows if only B is doped when the Si film 220 is formed. Thus, in the first embodiment, not only B is doped when the Si film 220 is formed, but also, as will be described below, an impurity is introduced from the exposed surface of the Si film 220 on purpose after the etch-back process (S116). As described above, it does not matter if B is doped when the Si film 220 is formed.

Figure 9A:
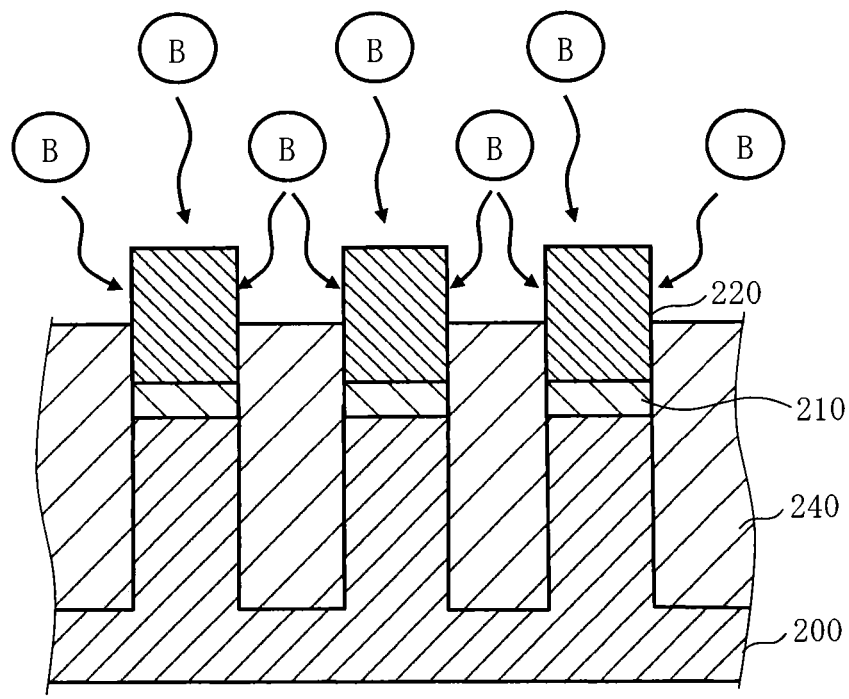
FIGS. 9A and 9B are process sectional views of the method for fabricating a semiconductor device according to the first embodiment.
Figure 9B:
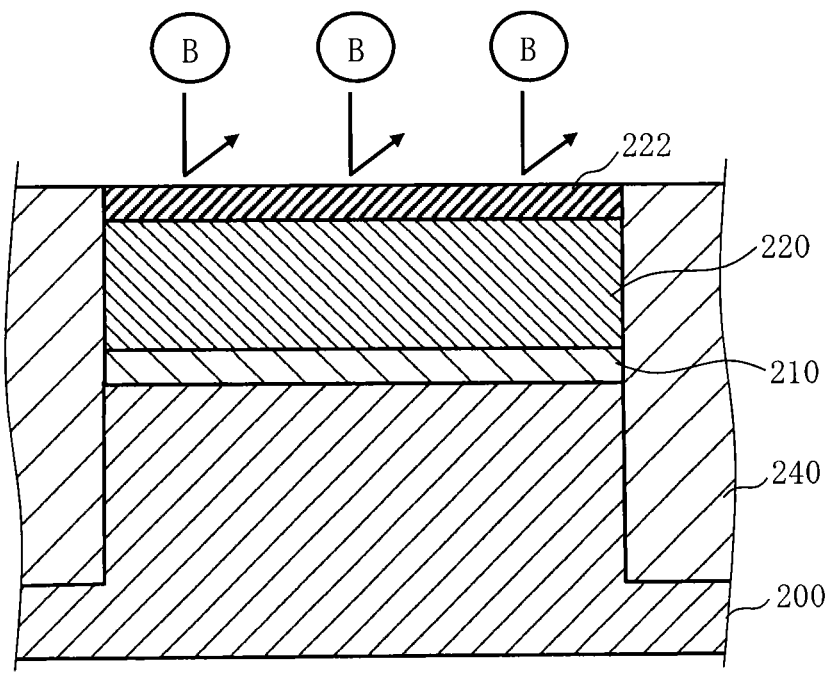

Process sectional views of the method for fabricating a semiconductor device according to the first embodiment are shown in FIGS. 9A and 9B. FIGS. 9A and 9B show the p-type impurity doping process (S118) in FIG. 1. Subsequent processes will be described later.

In FIG. 9A, as the p-type impurity doping process (S118), B is injected from the upper surface and side face of the Si film 220 that is exposed and contains no C in the memory cell region to diffuse B into the Si film 220. The gas phase doping (GPD) method is used as the injection method of B. By using the gas phase doping method, in contrast to the ion implantation method, there is no need to cover the peripheral circuit region with a mask. That is, the process of mask formation and the like can be omitted. According to the gas phase doping method, a dopant is injected by heat-treating the substrate in a gas atmosphere containing the dopant (B) as a p-type impurity. When B is injected as an impurity, B can be injected from the exposed upper surface and the exposed upper side face of the Si film 220 by heat-treating the Si film 220 at temperature of, for example, 500 to 800° C. in a gas atmosphere containing, for example, a boron trichloride ($BCl_3$) gas as a source gas. Here, the concentration of B is suitably controlled to, for example, $5 \times 10^{15}$ ($cm^{-2}$) or more.

In the peripheral circuit region, on the other hand, as shown in FIG. 9B, the exposed surface of the Si film 220 is the C containing portion 222 and the injection of B can be prevented by C. If the concentration of C in the C containing portion 222 is $4 \times 10^{20}$ ($cm^{-3}$) or more, the B dose in the peripheral circuit region can be suppressed to about $2 \times 10^{15}$ ($cm^{-2}$) or less that can be inverted to the n type in a subsequent process.

In the above example, a case when the p-type impurity doping process (S118) is performed after the C containing portion 222 in the upper portion of the Si film 220 is removed from the memory cell region, but the present embodiment is not limited to such an example. The C containing portion 222 may remain when the above process is performed. Because the C containing portion 222 is positioned in the upper portion of the Si film 220, even if the C containing portion 222 cannot be all removed by the etch-back process (S116) and a portion thereof remains, cell characteristics are not affected or an effect thereon can be minimized to the level of an error.

Figure 10:
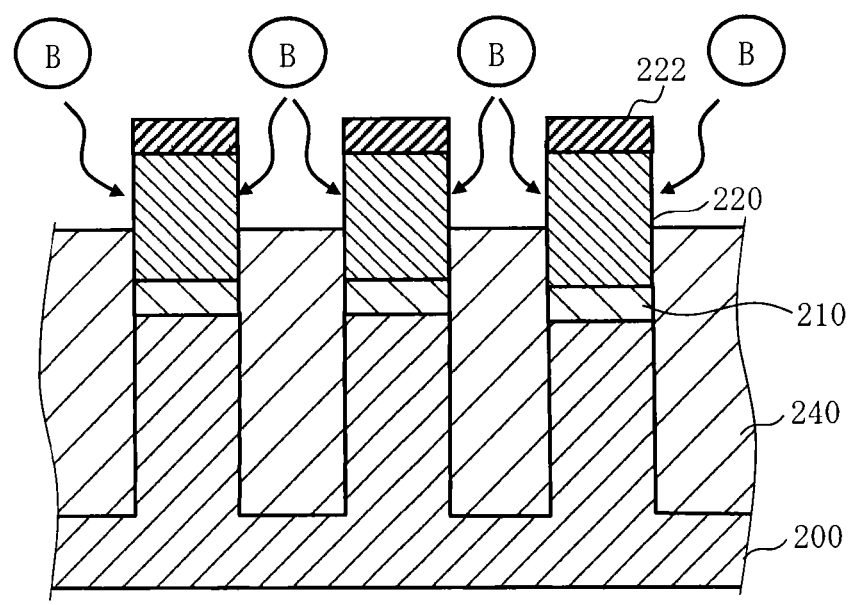
FIG. 10 is a diagram showing another example of process sectional views in a p-type impurity doping process according to the first embodiment.

FIG. 10 shows another example of process sectional views in the p-type impurity doping process according to the first embodiment. In FIG. 10, a case when a p-type impurity is doped while the C containing portion 222 in the upper portion of the Si film 220 remains is shown. In such a case, the injection of B is prevented in the C containing portion 222 in the upper portion of the Si film 220 and thus, B is mainly injected from the side face of the Si film 220 containing no C. Even in such a case, more B can be injected than in the peripheral circuit region. Also in the above example, a case when the dielectric film 240 for element isolation is retained without etching outside the memory cell region is shown in the etch-back process (S116), but the present embodiment is not limited to such an example. Even if the side face of the Si film 220 is exposed like in the memory cell region by etching the dielectric film 240 for element isolation outside the memory cell region such as in the peripheral circuit region, the volume of the Si film 220 in the peripheral circuit region or the like where the width dimension of the Si film 220 is wide is vastly greater than the volume of the Si film 220 in the memory cell region and, as a result, the B dose in the Si film 220 can be minimized. Further, if the C containing portion 222 in the upper portion in the memory cell region is selectively removed by also using side etching of the Si film 220 in the etch-back process (S116), more B can be injected into the Si film 220 in the memory cell region while the injection of B from the upper surface of the Si film 220 in the peripheral circuit region being suppressed by the C containing portion 222.

From the above, the Si film 220 in the memory cell region in the first embodiment becomes a p-type floating gate. Next, as the n-type impurity doping process (S119), the Si film 220 in the peripheral circuit region may be converted from the p type into the n type by covering the memory cell region with a mask such as a resist film (not shown) and injecting an n-type impurity as ions into the peripheral circuit region. In the peripheral circuit region, the concentration of B in the Si film 220 is suppressed when compared with the memory cell region and thus, the conversion into the n type is easy during mass production.

Figure 11A:
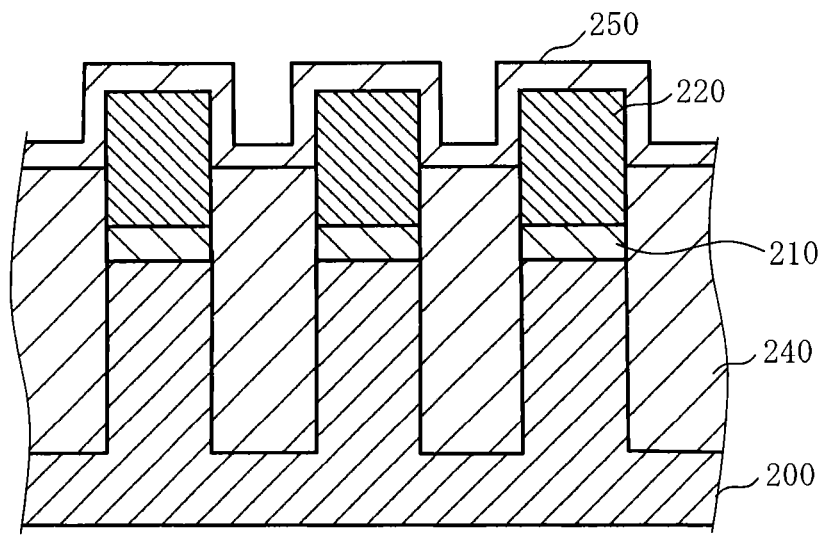
FIGS. 11A and 11B are process sectional views of the method for fabricating a semiconductor device according to the first embodiment.
Figure 11B:
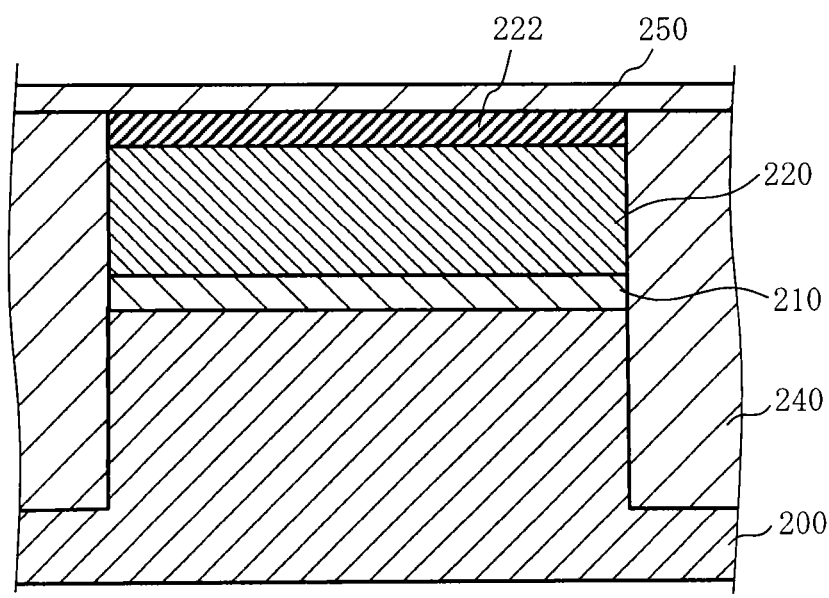

Process sectional views of the method for fabricating a semiconductor device according to the first embodiment are shown in FIGS. 11A and 11B. FIGS. 11A and 11B show the IPD film formation process (S120) in FIG. 1. Subsequent processes will be described later.

In FIG. 11A, as the IPD film formation process (S120), after the p-type impurity being injected, an inter poly dielectric (IPD) film 250 is formed on the upper surface of the Si film 220 to be a FG, a side face portion of the Si film 220 continuing from the upper surface up to the height position of the upper surface of the dielectric film 240 to cover the portion, and on the dielectric film 240 up to a thickness of, for example, 5 to 20 nm by using, for example, the CVD method. The IPD film 250 functions as a dielectric film between electrodes in a gate structure in the memory cell region. Also, as shown in FIG. 11B, the IPD film 250 is formed on the C containing portion 222 of the Si film 220 and the dielectric film 240 in the peripheral circuit region. The IPD film 250 suitably uses a high dielectric constant dielectric film, a laminated structure of silicon oxide/high dielectric constant film/silicon oxide, a laminated structure of silicon oxide/silicon nitride/silicon oxide, or a laminated structure in which one of the laminated structures is sandwiched between silicon nitrides.

Figure 12A:
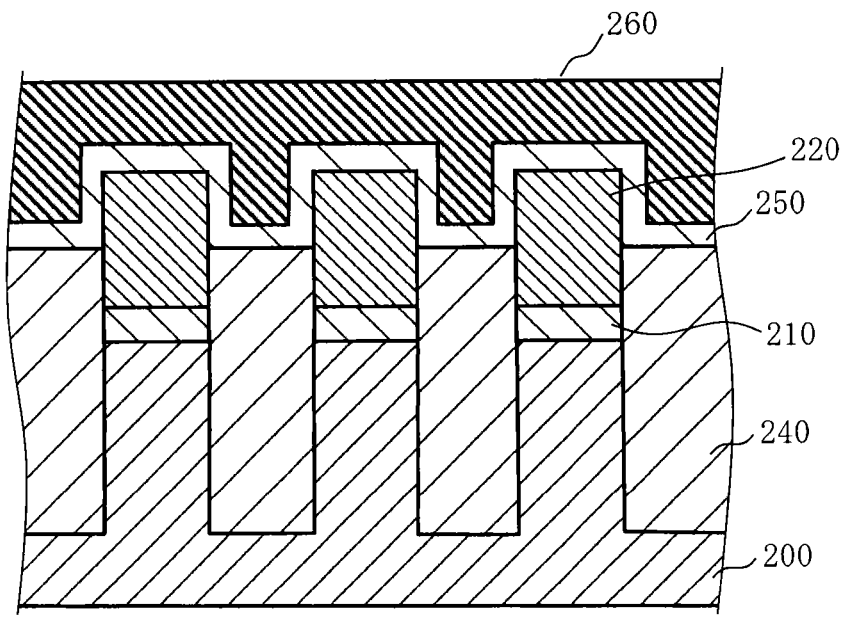
FIGS. 12A and 12B are process sectional views of the method for fabricating a semiconductor device according to the first embodiment.
Figure 12B:
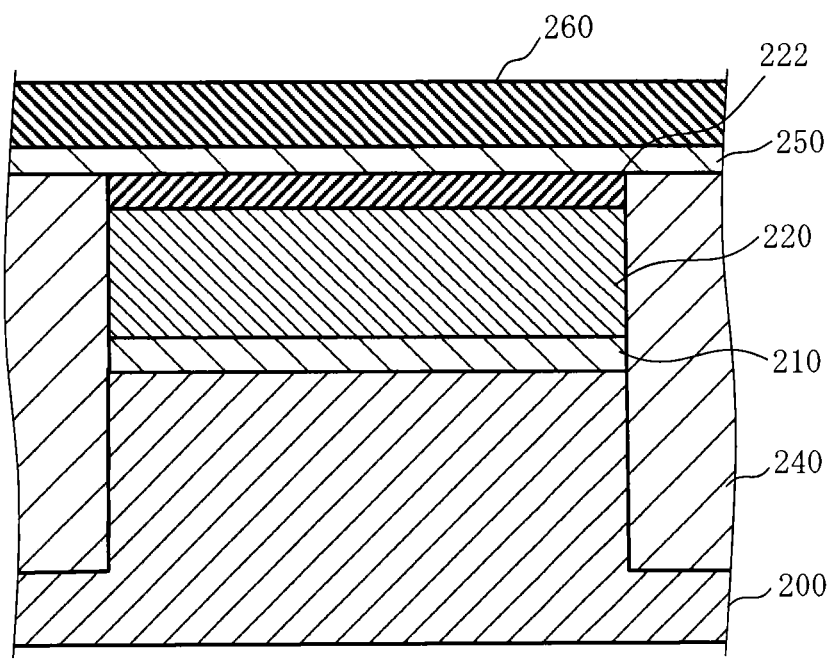

Process sectional views of the method for fabricating a semiconductor device according to the first embodiment are shown in FIGS. 12A and 12B. FIGS. 12A and 12B show the Si film formation process (S122) in FIG. 1. Subsequent processes will be described later.

In FIG. 12A, as the Si film formation process (S122), an Si film 260 is formed on the IPD film 250 to a thickness of, for example, 10 to 60 nm by using, for example, the CVD method. The Si film 260 is formed according to the LP-CVD method by supplying, for example, an $SiH_4$ gas as a source material to an amorphous silicon film and controlling the film formation temperature to 350 to 550° C. as the formation method thereof. The amorphous silicon film degenerates into a polysilicon film in a subsequent heating process.

The Si film 260 to be a polysilicon film functions as a portion of the control gate (CG). In this manner, the control gate is formed on the IPD film 250. A p-type FG is formed in the first embodiment and thus, the aspect ratio can be decreased by making the IPD film 250 thinner or reducing the height of the FG and a space between FGs adjacent in the element isolation direction being filled up by the IPD film 250 can be avoided. Therefore, the Si film 260 to be a portion of CG can be caused to function as an electrode by embedding the Si film 260 between FGs. As shown in FIG. 12B, the Si film 260 is formed on the IPD film 250 in the peripheral circuit region.

Figure 13A:
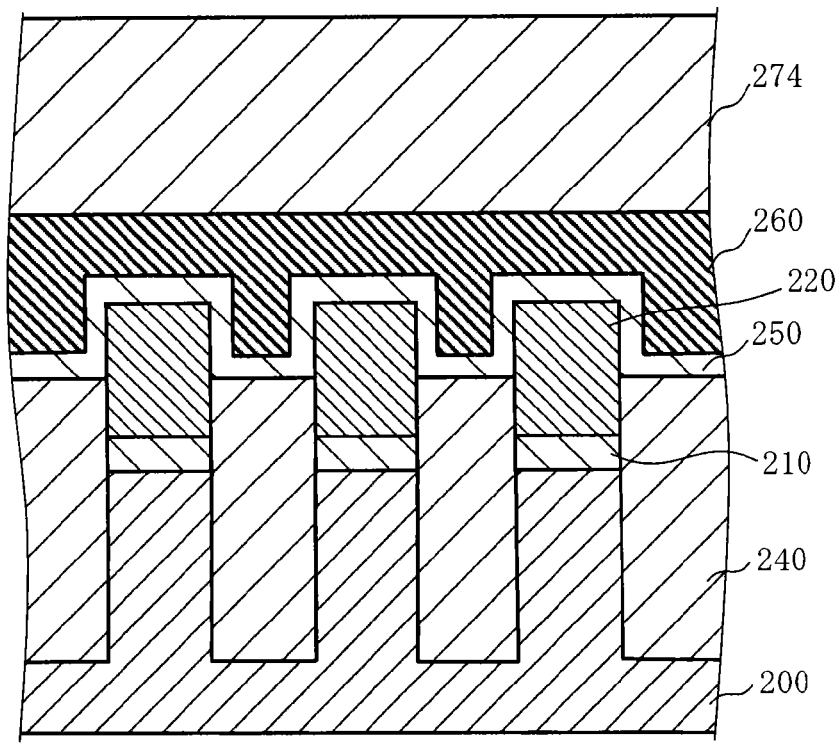
FIGS. 13A and 13B are process sectional views of the method for fabricating a semiconductor device according to the first embodiment.
Figure 13B:
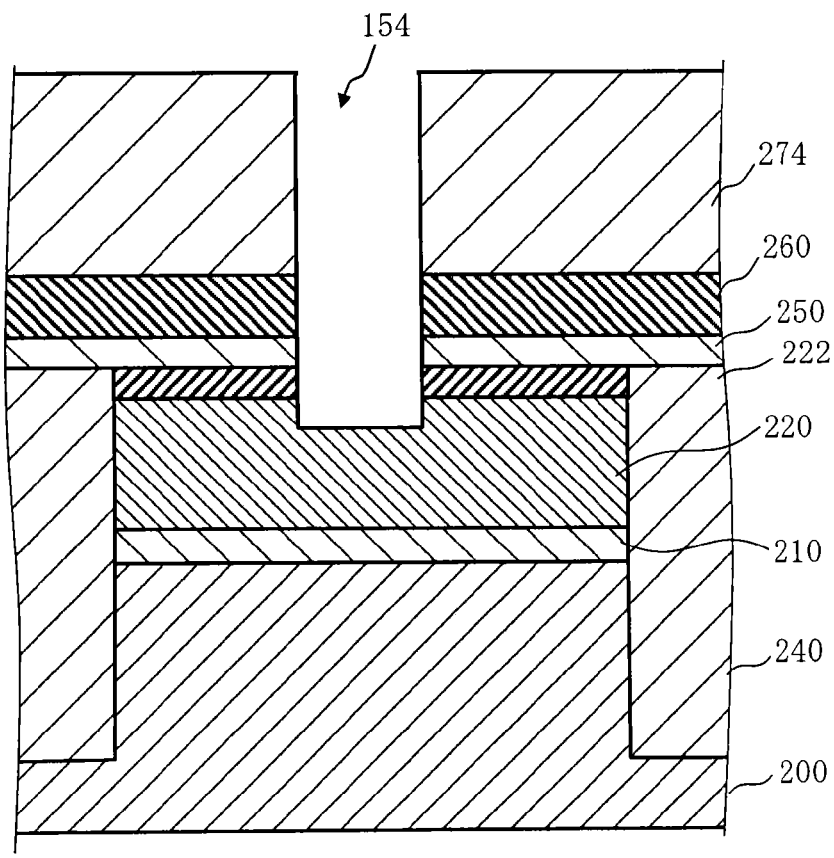

Process sectional views of the method for fabricating a semiconductor device according to the first embodiment are shown in FIGS. 13A and 13B. FIGS. 13A and 13B show the etching process (S124) in FIG. 1. Subsequent processes will be described later.

In FIG. 13B, as the etching process (S124), a resist film 274 is formed on the Si film 260 and then an opening 154 is formed from the Si film 260 up to halfway through the Si film 220 in a portion of the Si film 260 in the peripheral circuit region by using photolithography technology, RIE technology and the like. As shown in FIG. 13B, the opening 154 is suitably formed up to a height position penetrating through the C containing portion 222 in the upper portion of the Si film 220. Accordingly, an increase in resistance caused by C can be avoided. After the opening 154 being formed, the remaining resist film 274 may be peeled off by ashing or the like. On the other hand as shown in FIG. 13A, no opening is formed in the memory cell region.

Figure 14A:
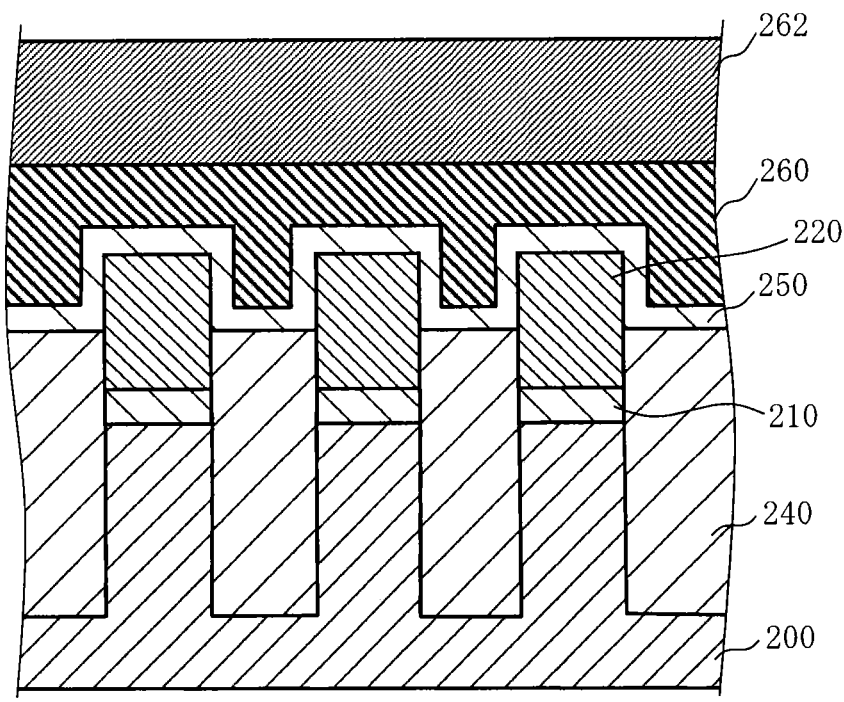
FIGS. 14A and 14B are process sectional views of the method for fabricating a semiconductor device according to the first embodiment.
Figure 14B:
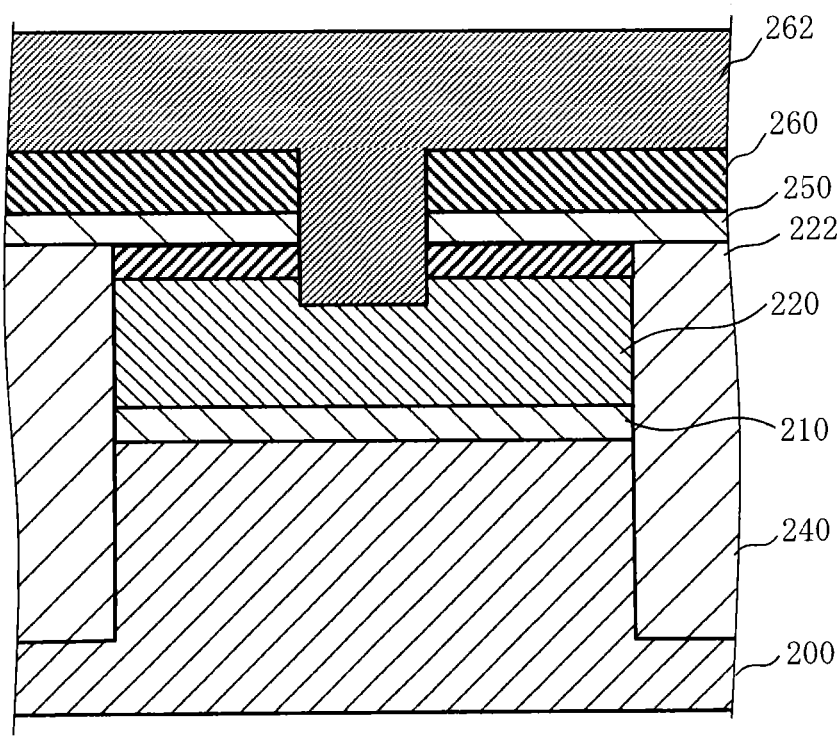

Process sectional views of the method for fabricating a semiconductor device according to the first embodiment are shown in FIGS. 14A and 14B. FIGS. 14A and 14B show the metal film formation process (S126) in FIG. 1.

In FIG. 14A, as the metal film formation process (S126), a metal film 262 is formed on the Si film 260 to a thickness of, for example, 30 nm or less by using, for example, the CVD method. The metal film 262 functions as a portion of the remaining control gate (CG). That is, the control gate has a laminated structure in which the Si film 260 as a polysilicon film and the metal film 262 are stacked. A film stack of the Si film 260 and the metal film 262 functions as a word line in a memory device. For example, a tungsten (W) film is suitably used as the metal film 262. Instead of the W film, a film stack of the W film and tungsten nitride (WN) may be used. Alternatively, the W film alone or a film stack of the W film and tungsten nitride (WN) may be used as the control gate without using the Si film 260. Alternatively, a film stack of the W film and another conductive film may be used as the control gate. It is still better to form a silicide film by siliciding the interface between the Si film 260 and the metal film 262. On the other hand, as shown in FIG. 14B, the metal film 262 is connected to the Si film 220 by penetrating through the C containing portion 222 in the peripheral circuit region. Accordingly, as described above, an increase in resistance caused by C can be avoided.

After the metal film formation process (S126) described above being performed, an opening as a gate pattern groove may be formed on both sides of a gate structure portion along the longitudinal direction of the CG (word line). Such an opening is suitably formed to a width of 20 nm or less at intervals of 40 nm or less in pitch. Accordingly, the Si film 220 is isolated for each memory cell in a direction perpendicular to the longitudinal direction of the CG (word line) to form a floating gate (charge storage layer) and also the control gate (CG) is processed into a word line shape. The opening is caused to etch through (or "penetrate") the metal film 262 to the Si film 220 by a lithography process and a dry etching process (not shown).

Next, ions of an n-type impurity are injected into the semiconductor substrate 200 from above the gate dielectric film 210 at the bottom of the opening to form an n-type semiconductor region in a region between gate structures on the surface of the p-type semiconductor substrate 200. Such an n-type semiconductor region functions as a source/drain region (S/D). A p-type semiconductor region sandwiched between n-type semiconductor regions functions as a channel region in which a gate region (G) is formed in an upper portion thereof. Accordingly, a NAND string structure in which a plurality of cells (gate structures) wherein a source portion of one cell of adjacent cells and a drain portion of the other cell are shared is arranged is formed (not illustrated). Further, after dielectric films being formed above the gate structure and between the gate structures formed as described above, contacts and wires connected to the gate structure or the surface of the semiconductor substrate 200 are formed via the dielectric films.

According to the first embodiment, as described above, when a p-type floating gate is formed, the doping amount of a p-type impurity into the peripheral circuit region can be reduced without using a mask. Therefore, the number of processes in the manufacture of semiconductor devices can be reduced. In addition, in the peripheral circuit region, the concentration of B in the Si film 220 is suppressed when compared with the memory cell region and thus, the conversion into the n type is easy during mass production. Further, the aspect ratio can be decreased by adopting a p-type floating gate to make the thickness of an IPD film thinner or reduce the height of the floating gate so that still finer cells can be formed. Also, embedding properties of a control gate between adjacent floating gates can be improved. Moreover, B is doped after the etch-back of the dielectric film for element isolation and therefore, out-diffusion of B doped in the floating gate can be reduced.

In the foregoing, embodiments have been described with reference to concrete examples. However, the present disclosure is not limited to such concrete examples.

In addition, all semiconductor devices and methods for fabricating a semiconductor device that include elements of the present disclosure and whose design can be changed as appropriate by persons skilled in the art are included in the scope of the present disclosure.

While techniques normally used in the semiconductor industry such as cleaning before and after treatment are not described for convenience of description, it is needless to say that such techniques are included in the scope of the present disclosure.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A method for fabricating a semiconductor device, comprising:
    forming a silicon (Si) film containing carbon (C) in an upper portion thereof above a semiconductor substrate;
    performing element isolation of the Si film and the semiconductor substrate to make a width dimension of the Si film narrow in a first region and a width dimension of the Si film wide in a second region, wherein the first region is a cell region and the second region is a peripheral region;
    after the element isolation, exposing a side face of the Si film in at least the first region; and
    diffusing boron (B) into the Si film from the side face of the Si film in the first region,
    wherein the side face of the Si film of only the first region, among the first and second regions, is exposed.

2. The method according to claim 1, wherein when the side face of the Si film is exposed, the upper portion containing the C in the Si film is further removed in the first region.

3. The method according to claim 1, wherein when the B is diffused, a gas phase doping method is used.

4. The method according to claim 1, wherein when the Si film is formed, after an Si source gas is supplied without a C source gas being supplied, the Si source gas and the C source gas are supplied.

5. The method according to claim 4, wherein when the Si film is formed, a chemical vapor deposition (CVD) method is used.

6. The method according to claim 4, wherein the Si film is formed until a remaining thickness is 5 to 10 nm by supplying the Si source gas without supplying the C source gas and the C source gas is added when the remaining thickness of 5 to 10 nm of the Si film is formed.

7. The method according to claim 1, wherein when the Si film is formed, the upper portion of the Si film is caused to contain C to have a concentration of C of $4 \times 10^{20}$ ($cm^{-3}$) or more.

8. The method according to claim 1, wherein when the element isolation is performed, a first opening of the first region and a second opening of the second region are formed by etching through the Si film and halfway through the semiconductor substrate.

9. The method according to claim 8, wherein when the element isolation is performed, a dielectric film to fill up the first opening and the second opening is formed.

10. The method according to claim 9, wherein the side face of the Si film is exposed in the first region by etching the dielectric film in the first region.

11. The method according to claim 10, wherein when the dielectric film is etched, the upper portion containing the C in the Si film is removed together.

12. The method according to claim 11, wherein an upper surface of the Si film that does not contain the carbon is exposed by the upper portion containing the C in the Si film being removed.

13. The method according to claim 10, wherein when the dielectric film is etched, the dielectric film of, among the first and second regions, only the first region is etched up to a height position halfway through the Si film.

14. The method according to claim 13, wherein when the B is diffused, an upper portion of the Si film in the second region is covered with the upper portion containing the C and a side face of the Si film in the second region is covered with the dielectric film.

15. The method according to claim 1, further comprising: diffusing an n-type impurity into the Si film in the second region after the B being diffused into the Si film.

16. The method according to 1, wherein the Si film in the first region becomes a floating gate of the memory cell.

17. The method according to claim 16, further comprising: forming a dielectric film on the Si film to cover the side face of the Si film exposed after the B being diffused into the Si film.

18. The method according to claim 17, further comprising: forming a film to be a control gate of the memory cell above the dielectric film.

* * * * *